(12) United States Patent
Oyaizu et al.

(10) Patent No.: US 8,716,943 B2
(45) Date of Patent: May 6, 2014

(54) LIGHT-EMITTING DEVICE AND LIGHTING APPARATUS PROVIDED WITH THE SAME

(75) Inventors: Tsuyoshi Oyaizu, Yokosuka (JP); Seiko Kawashima, Yokosuka (JP); Haruki Takei, Yokosuka (JP); Akiko Saito, Yokosuka (JP)

(73) Assignee: Toshiba Lighting and Technology Corporation, Kanagawa (JP)

( * ) Notice: Subject to any disclaimer, the term of this patent is extended or adjusted under 35 U.S.C. 154(b) by 548 days.

(21) Appl. No.: 13/027,788

(22) Filed: Feb. 15, 2011

(65) Prior Publication Data

US 2011/0199021 A1     Aug. 18, 2011

(30) Foreign Application Priority Data

Feb. 16, 2010  (JP) .................................. 2010-030806
Jun. 28, 2010  (JP) .................................. 2010-146730

(51) Int. Cl.
*H05B 37/02*  (2006.01)
*F21S 4/00*  (2006.01)

(52) U.S. Cl.
USPC .................... 315/185 R; 315/294; 262/249.01

(58) Field of Classification Search
USPC .......... 315/200 R, 209 R, 224, 225, 291, 307, 315/185 R, 294; 362/249.01, 235
See application file for complete search history.

(56) References Cited

U.S. PATENT DOCUMENTS

| | | | |
|---|---|---|---|
| 7,322,718 B2 * | 1/2008 | Setomoto et al. ............. | 362/276 |
| 2006/0131708 A1 | 6/2006 | Ng et al. | |
| 2007/0041185 A1 | 2/2007 | Yatsuda et al. | |
| 2007/0242461 A1 | 10/2007 | Reisenauer | |
| 2010/0073931 A1 * | 3/2010 | Watanabe ................ | 362/249.02 |

FOREIGN PATENT DOCUMENTS

| | | |
|---|---|---|
| CN | 101589266 | 11/2009 |
| EP | 0191261 | 8/1986 |
| EP | 2180765 | 4/2010 |
| JP | 2009-54989 | 3/2009 |
| JP | 2009-071227 | 4/2009 |
| JP | 2009-164567 | 7/2009 |
| JP | 2009-290244 | 12/2009 |
| WO | WO 01/01385 | 1/2001 |
| WO | WO 2004/068909 | 8/2004 |
| WO | WO 2009/104645 | 8/2009 |

OTHER PUBLICATIONS

English Language Abstract of JP 2009-54989 published Mar. 12, 2009.
English Language Translation of JP 2009-54989 published Mar. 12, 2009.
English Language Abstract of JP 2009-290244 published Dec. 10, 2009.

(Continued)

*Primary Examiner* — Jimmy Vu
(74) *Attorney, Agent, or Firm* — DLA Piper LLP (US)

(57) ABSTRACT

According to one embodiment, a light-emitting device includes a substrate including an insulating surface, a plurality of light-emitting elements mounted on the surface of the substrate and electrically connected to each other, a positive power feeding conductor and a negative power feeding conductor mounted on the surface of the substrate to feed power to the light-emitting elements, lead-out terminals leading from the power feeding conductors, to the outside of an mounting area of the light-emitting elements, and an anti-noise part connected to the lead-out terminals and arranged outside the mounting area.

8 Claims, 12 Drawing Sheets

(56) References Cited

OTHER PUBLICATIONS

English Language Translation of JP 2009-290244 published Dec. 10, 2009.
Chinese Office Action issued in CN 201110038806.6 on Feb. 5, 2013.
English Language Abstract of Chinese Office Action issued in CN 201110038806.6 on Feb. 5, 2013.
English Language Abstract of WO 2009/104645 published Aug. 27, 2009.
English Language Abstract of JP 2009-071227 published Apr. 2, 2009.
English Language Translation of JP 2009-071227 published Apr. 2, 2009.
Chinese Office Action issued in CN 201110038806.6 on Oct. 15, 2013.
English Language Translation of Chinese Office Action issued in CN 201110038806.6 on Oct. 15, 2013.
English Language Abstract of CN 101589266 published Nov. 25, 2009.
Japanese Office Action issued in JP 2010-030806 issued Jul. 2, 2013.
English Language Translation of Japanese Office Action issued in JP 2010-030806 issued Jul. 2, 2013.
English Language Abstract of JP 2009-164567 published Jul. 23, 2009.
English Language Translation of JP 2009-164567 published Jul. 23, 2009.
European Search Report issued in European Application No. 11154499.5 dated Nov. 22, 2013.
English Language Abstract of EP 0191261 published Aug. 20, 1986.

\* cited by examiner

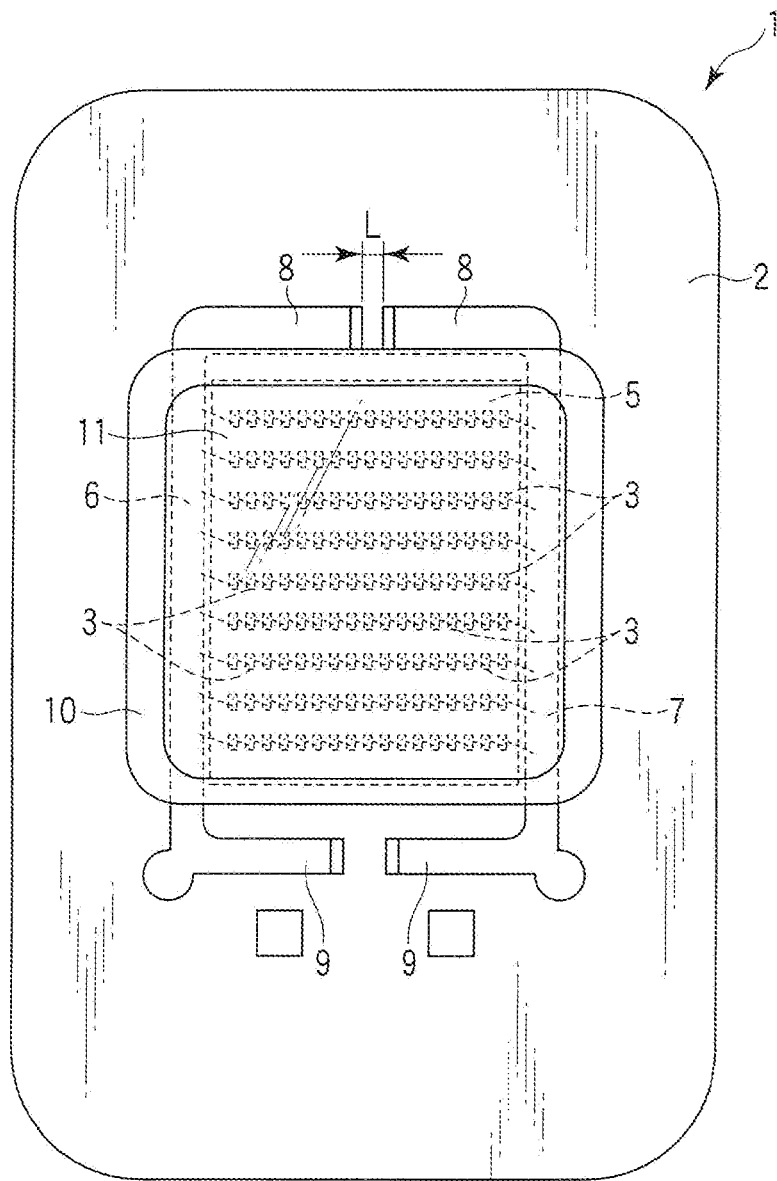
F I G. 2

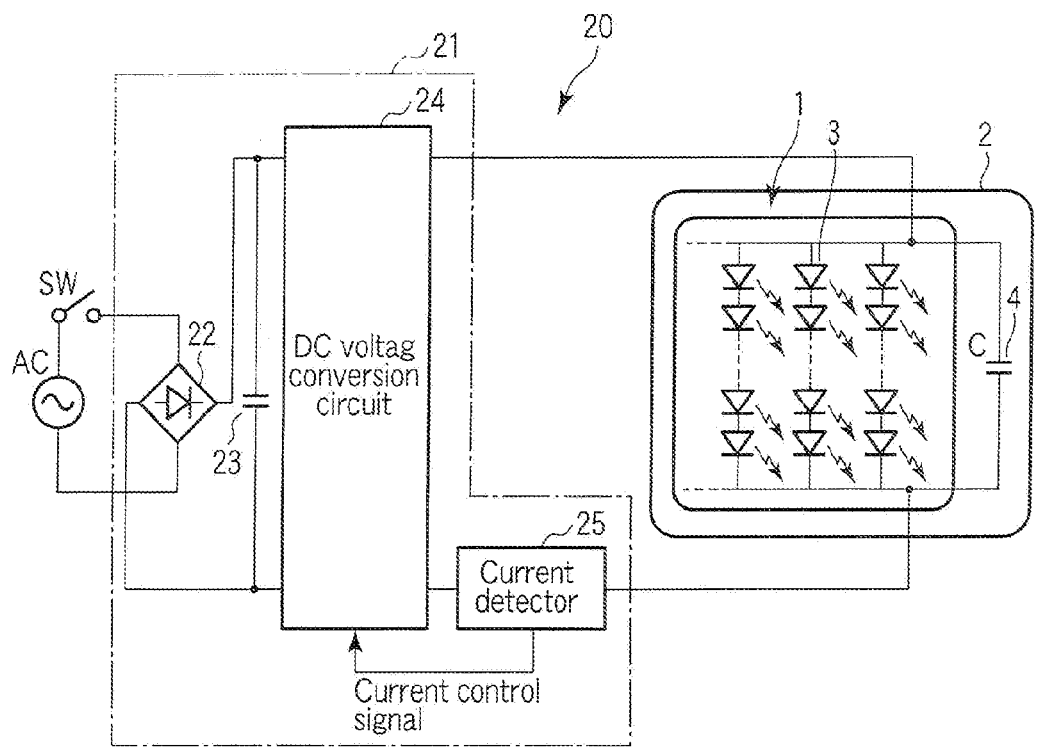
F I G. 4
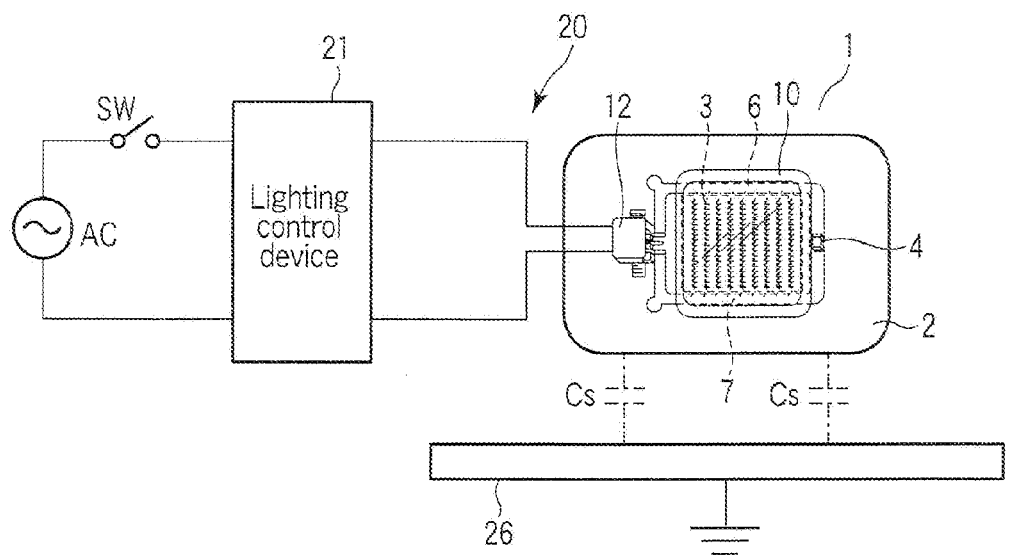
F I G. 5

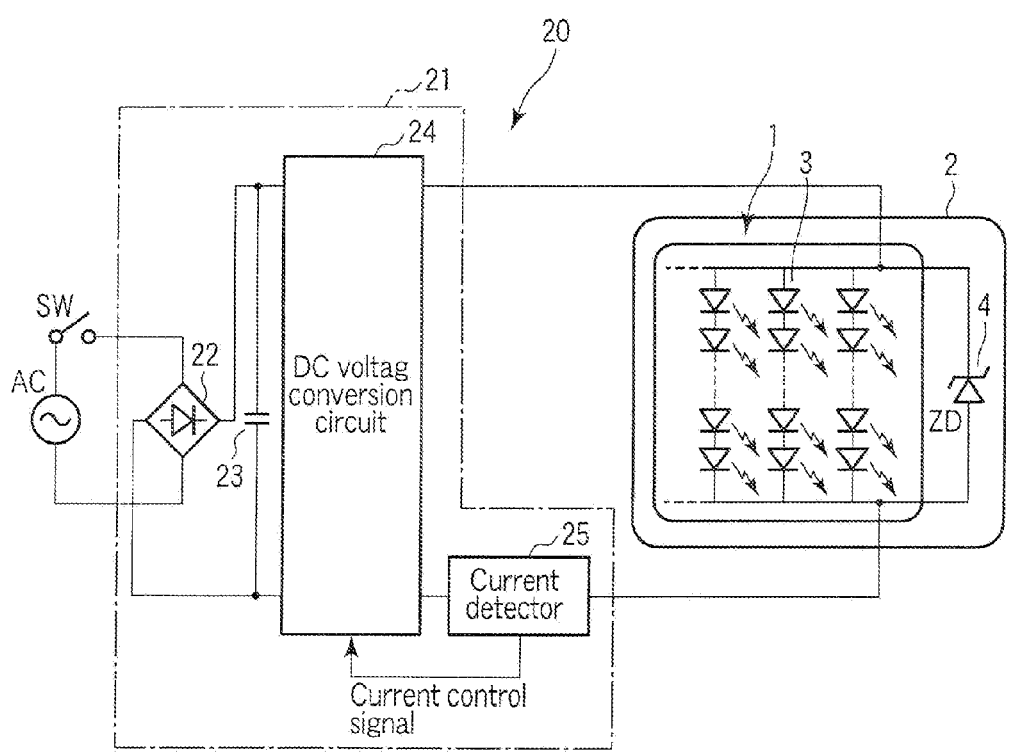
F I G. 9

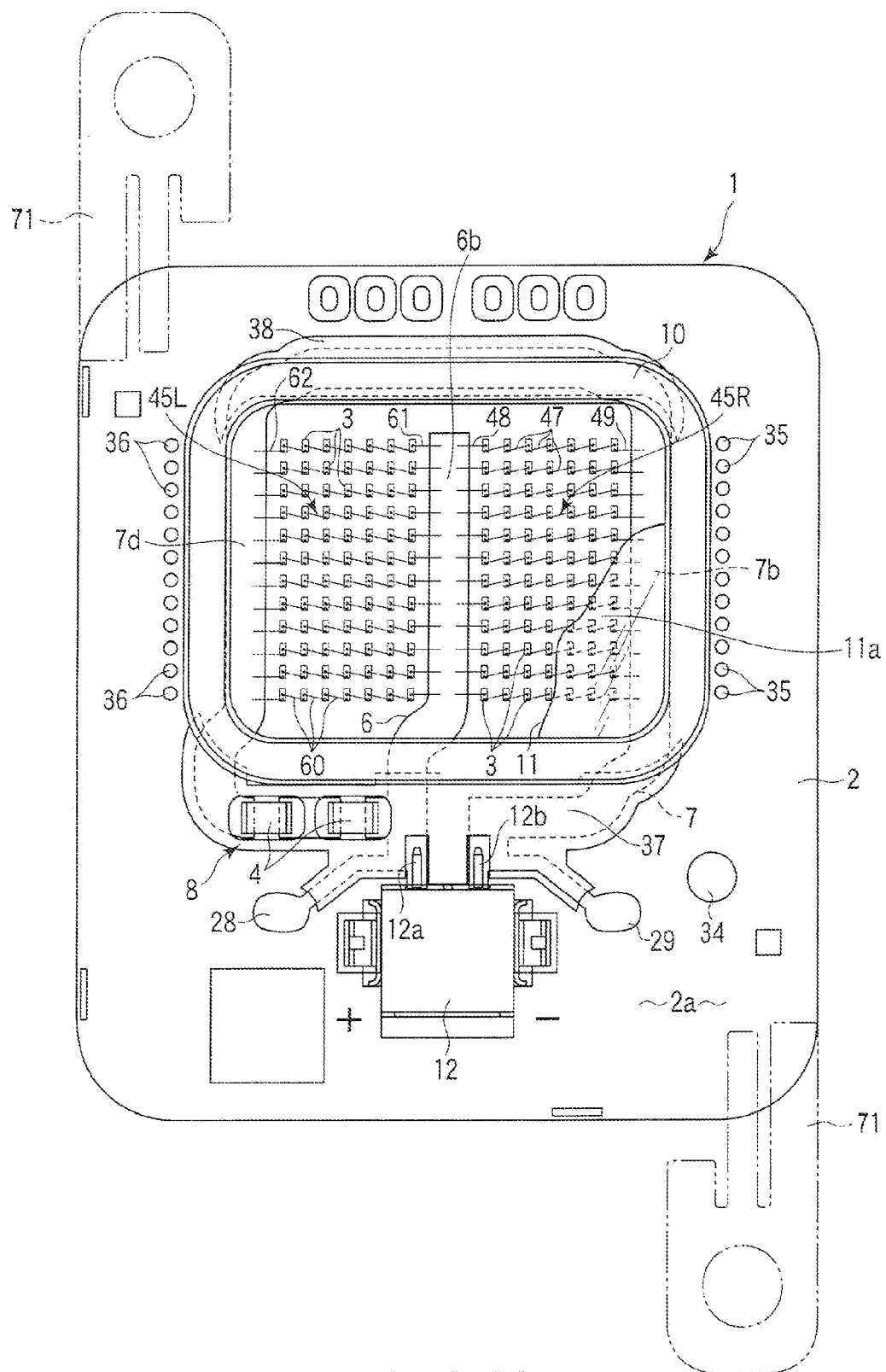
F I G. 12

LIGHT-EMITTING DEVICE AND LIGHTING APPARATUS PROVIDED WITH THE SAME

CROSS-REFERENCE TO RELATED APPLICATIONS

This application is based upon and claims the benefit of priority from Japanese Patent Applications No. 2010-030806, filed Feb. 16, 2010; and No. 2010-146730, filed Jun. 28, 2010; the entire contents of both of which are incorporated herein by reference.

FIELD

Embodiments described herein relate generally to a light-emitting device using a light-emitting element such as an LED, and a lighting apparatus provided with the light-emitting device.

BACKGROUND

Recently, a light-emitting diode (LED) has been used as a light source of a lighting apparatus. In this light source, a number of LED bare chips are mounted on a substrate, and each LED chip is electrically connected to a wiring pattern by bonding wires. A plurality of such substrates is housed in a main body made of metal such as aluminum (Jpn. Pat. Appln. KOKAI Publication No. 2009-54989).

In such a lighting apparatus, power is usually supplied from a lighting control device connected to commercial power source, and lighting of the LED chip is controlled. The metallic main body is maintained at a ground potential.

However, in the above lighting apparatus, though a power switch (one-position) of the lighting control device is being turned off, an LED chip is accidentally lit dimly. This phenomenon is caused by a noise superimposed on a power line. Stray capacitance is generated between a conductor such as the wiring pattern connected to the LED chips and the metallic main body close to the conductor, and a minute current flows in the LED chip as a leakage current.

Further, when the power switch is turned on, a rush current may flow into LED chips as a noise, and break the LED chips. As well known, an LED is weak to electrostatic breakdown, and is easily broken when subjected to a high voltage caused by a noise such as static electricity. For example, a worker may touch a wiring pattern while assembling a lighting apparatus. In such a case, if the worker's hand is electrostatically charged, an overcurrent is applied to an LED, and damages or breaks the LED. In addition, jigs and tools electrostatically charged during the assembling work discharges electricity, an overcurrent is applied to an LED, and damages or breaks the LED, decreasing the reliability.

To solve the above problems, or to prevent accidental lighting, a capacitor is inserted as a bypass element in parallel to an LED chip. To prevent a damage or breakage of an LED by static electricity, a capacitor or a constant-voltage diode is inserted as a protective element.

These capacitor and constant-voltage diode as anti-noise parts may be mounted on a circuit board of a power supply circuit, or mounted together with an LED on the same substrate.

However, when the capacitor and constant-voltage diode as anti-noise parts are mounted on a circuit board of a power supply circuit, a wiring pattern and land are additionally provided on the circuit board, and the components must be connected to these pattern and land, resulting in a complex structure. Further, when such components are mounted together with LEDs on the same substrate on which the LEDs are mounted as a light-emitting element, the anti-noise parts obstruct the light emitted from the LEDs.

BRIEF DESCRIPTION OF THE DRAWINGS

FIG. 2 is a plan view of the light-emitting device before anti-noise parts and connectors are mounted;

FIG. 4 is a circuit configuration of a lighting apparatus according to a first embodiment;

FIG. 5 is a schematic connection diagram of the lighting apparatus;

FIG. 9 shows a circuit configuration of a lighting apparatus according to a fourth embodiment;

FIG. 12 is a front plan view of a light-emitting device of the street light according to the fifth embodiment;

DETAILED DESCRIPTION

Figure 1:
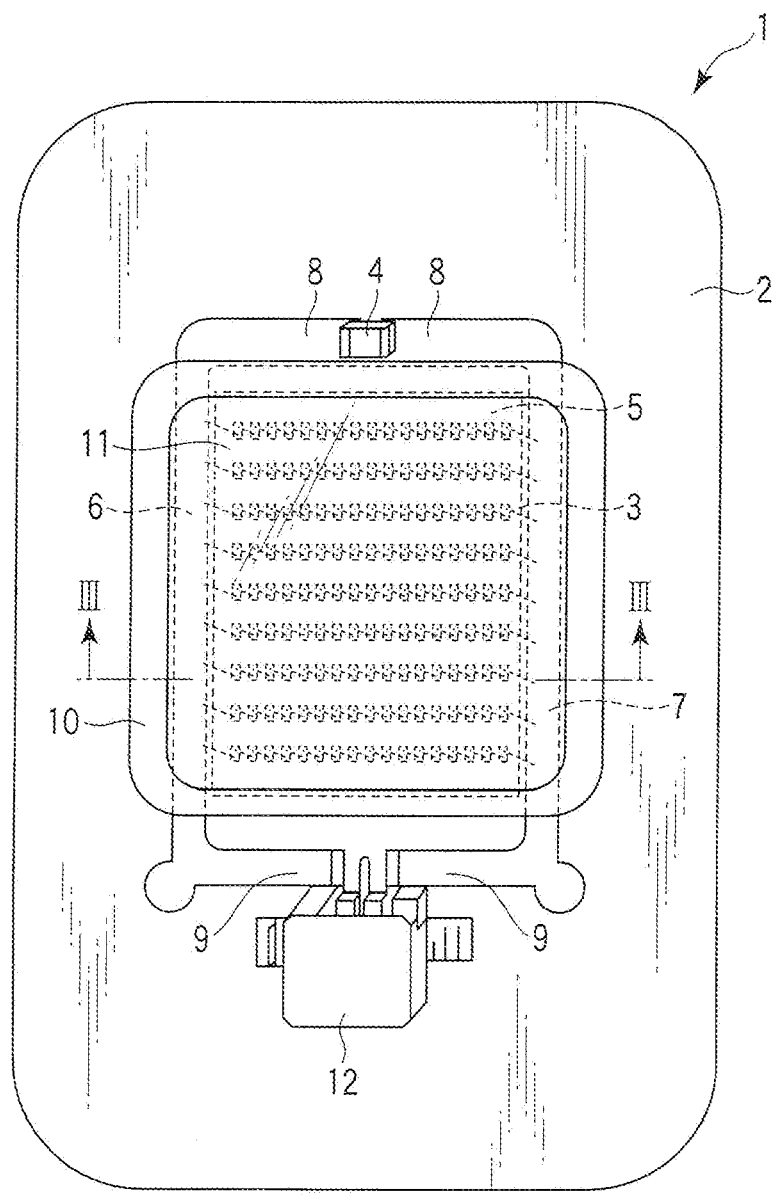
FIG. 1 is a front plan view of a light-emitting device according to a first embodiment.

In general, according to one embodiment, a light-emitting device comprises a substrate including an insulating surface; a plurality of light-emitting elements mounted on the surface of the substrate and electrically connected to each other; a positive power feeding conductor and a negative power feeding conductor disposed on the surface of the substrate to feed power to the light-emitting elements; lead-out, terminals leading from the power feeding conductors, to the outside of an mounting area of the light-emitting elements; and an anti-noise part connected to the lead-out terminals and arranged outside the mounting area.

A substrate may be made of ceramic material or synthetic resin material such as glass epoxy resin, or may be formed of a metallic base board with an insulating layer formed on one side of a base plate such as aluminum with high thermal conductivity and heat radiation. A light-emitting element is a solid light-emitting element such as an LED. The number of mounted light-emitting elements is not particularly limited.

Positive and negative power feeding conductors, and a lead-out terminal are made of conductive material such as copper foil. A conductive part has a three layered structure. A first layer may be formed by etching copper. On the copper layer, nickel (Ni) may be plated as a second layer. Silver (Ag) may be plated as a third layer. According to the embodiment, an anti-noise part is connected by using the positive and negative power feeding conductors.

An anti-noise part is a part for preventing accidental lighting, damage or breakage of a light-emitting element due to, e.g., noises superimposed on a power line or caused by static electricity and the like. Such a part is connected parallel to a connection circuit of a light-emitting element, and functions as a bypass element or a protective element. A capacitor and a constant-voltage diode are used as an anti-noise part, but the anti-noise part is not limited to these components.

According to the embodiment, in the light-emitting device, the anti-noise part comprises a plurality of the same elements, the lead-out terminal comprises a lead-out conductor continued from the positive and negative power feeding conductors, and at least one connection conductor is provided with predetermined distance between the edges of the lead-out conductor. The same elements are connected between the lead-out conductor and connection conductor, or between one connection conductor and the other connection conductor.

The same elements mean a plurality of capacitors as a protective element connected and mounted in series. This structure can set the distance between conductors longer.

The lighting apparatus according to the embodiment comprises an apparatus main body, a lighting device arranged in the main body, and a lighting control device configured to supply power to the light-emitting device. The lighting apparatus includes a light source and a lighting fixture used indoors and outdoors, and a display unit.

According to the embodiment, it is possible to provide a light-emitting device and lighting apparatus, which are configured to prevent defects caused by noises, and simply constructed so that an anti-noise part does not obstruct the light emitted from each light-emitting element. It is also possible to prevent deterioration of insulation caused by a migration phenomenon.

Figure 3:
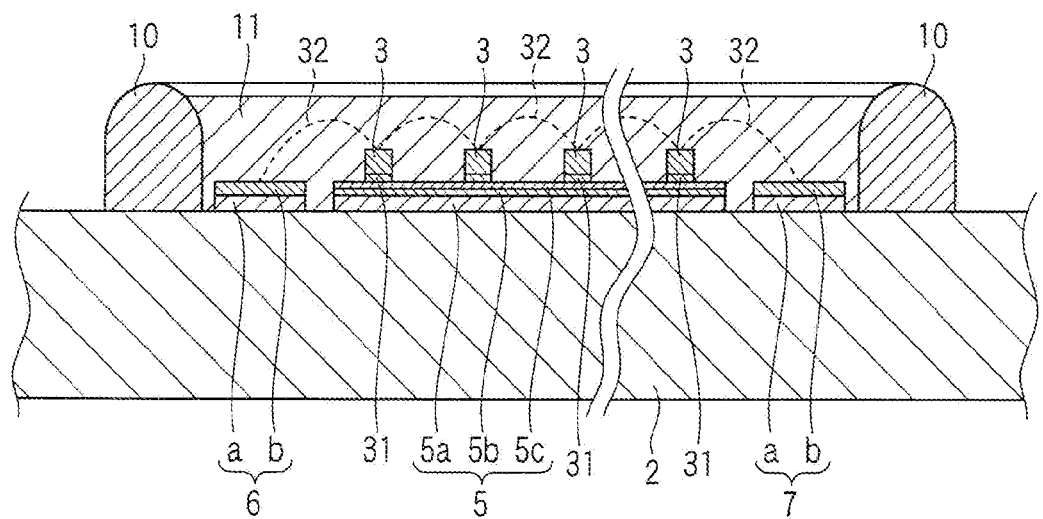
FIG. 3 is a sectional view of the light-emitting device along line in FIG. 1.

Hereinafter, a lighting apparatus according to a first embodiment will be explained with reference to FIGS. 1 to 5. FIGS. 1, 2, and 3 show a light-emitting device of the lighting apparatus. FIG. 4 shows the lighting apparatus. The same parts in the drawings are given the same reference numbers, and an explanation thereof is omitted.

As shown in FIGS. 1 to 3, a light-emitting device 1 of a lighting apparatus comprises a substantially rectangular substrate 2, and a number of light-emitting elements 3 mounted on the substrate 2, and an anti-noise part 4. On the front surface of the substrate 2, for example, a rectangular reflection layer 5 is formed, and the light-emitting elements 3 are mounted on the reflection layer 5. In the circumference of the reflection layer 5 on the substrate 2, a positive power feeding conductor 6, a negative power feeding conductor 7, a pair of lead-out terminals 6, a pair of power feeding terminals 9, a frame member 10, and a sealing member 11 covering the light-emitting elements 3 are provided.

The substrate 2 is made of ceramics such as white aluminum oxide or aluminum nitride for forming an insulating layer. The reflection layer 5 is formed at the center of the front surface of the substrate 2. On the reflection layer 5, 100 or more light-emitting elements 3 are bonded with a silicon resin adhesive.

The substrate 2 may be made of a metallic substrate with an insulating layer formed on one side of a base plate such as aluminum with high thermal conductivity and heat radiation, to increase the heat radiation of each light-emitting element 3. The substrate 2 may be made of synthetic resin material with insulation property such as glass epoxy resin.

On the front surface of the substrate 2, the reflection layer 5, positive power feeding conductor 6, negative power feeding conductor 7, lead-out terminals 8, and power feeding terminals 9 are formed. The reflection layer 5 is shaped substantially rectangular. The positive power feeding conductor 6 and negative power feeding conductor 7 are formed parallel to the opposing two sides of the reflection layer 5, with a distance (insulation distance) to the reflection layer 5. A pair of lead-out terminals 8 continuously extends in the substantially orthogonal direction from one ends of the positive power feeding conductor 6 and negative power feeding conductor 7. The ends of the lead-out terminals 8 are opposed with a predetermined distance (insulating distance) L.

From the other ends of the positive power feeding conductor 6 and negative power feeding conductor 7, power feeding terminals extend in the substantially orthogonal direction, and the extended ends are opposed with a predetermined distance.

As shown in FIG. 3, the reflection layer 5 has a three-layered structure, for example. On the front surface of the substrate 2, a copper pattern layer is formed by etching as a first layer 5a. A second layer 5b is a plated layer formed by plating nickel (Ni) on the copper pattern layer. A third layer 5c is a plated layer formed by plating silver (Ag) on the second nickel-plated layer. The third layer 5c of the reflection layer 5, that is, the silver-plated front layer has a high total reflectivity of 90%.

The positive power feeding conductor 6, negative power feeding conductor 7, lead-out terminals 8, and power feeding terminals 9 have two-layered-structure. A first layer a is formed by a copper pattern, and a second layer b is formed by a resist layer formed on the copper pattern. Similar to the reflection layer 5, the positive power feeding conductor 6, negative power feeding conductor 7, lead-out terminal 8, and power feeding terminal 9 may be constructed in a three-layered structure of copper, nickel and silver. The light-emitting element 3 can be directly bonded to the substrate 2, without forming a reflection layer 5.

A plurality of light-emitting elements 3 uses LED bare chips. An LED bare chip emitting blue light is used to emit white light from a light-emitting part. LED bare chips are bonded to the reflection layer 5 with a silicon resin adhesive 31. A plurality of light-emitting elements 3 is arranged in matrix, forming lines of light-emitting elements.

An LED bare chip is an InGaN element, for example, in which a light-emitting layer is formed on a translucent sapphire element. The light-emitting layer is formed by sequentially laminating an n-type nitride semiconductor layer, an InGan light-emitting layer, and a p-type nitride semiconductor layer. An electrode to flow a current to the light-emitting layer comprises a positive electrode formed by an p-type electrode pad on the p-type nitride semiconductor layer, and a negative electrode formed by an n-type electrode pad on the n-type nitride semiconductor layer. These electrodes are electrically connected by bonding wires 32. The bonding wire 32 is made of a gold (Au) thin wire, and is connected through a bump composed mainly of gold, to increase the mounting strength and decrease damages of the LED bare chip.

Specifically, in each line of light-emitting elements 3, the different polarity electrodes of two light-emitting elements 3 adjacent in the line extending direction, that is, the positive electrode of one light-emitting element 3 and the negative electrode of the other light-emitting element 3 are sequentially connected by the bonding wire 32. As a result, a plurality of light-emitting elements 3 forming each line of light-emitting elements is electrically connected in series. Therefore, a plurality of light-emitting elements 3 is simultaneously lit when energized.

In each line of light-emitting elements, the electrode of the light-emitting element 3 placed at the end of the line is connected by the bonding wire 32 to the positive power feeding conductor 6 or negative power feeding conductor 7. Therefore, a plurality of light-emitting element lines is provided electrically in parallel, and powered through the positive power feeding conductor 6 and negative power feeding conductor 7.

The frame member 10 is bonded to the substrate 2 by applying uncured silicone resin with a predetermined viscosity by means of a dispenser, and then curing the resin by heating. The frame member 10 is shaped substantially rectangular, and has an inner surface surrounding the reflection layer 5, positive power feeding conductor 6, and negative power feeding conductor 7. The mounting area of the light-emitting elements 3 is surrounded by the frame member 10.

The sealing member 11 is made of translucent synthetic resin, for example, transparent silicon resin, and is filled inside the frame member 10, and provided on the substrate 2. The sealing member 11 seals the reflection layer 5, the portions of the positive power feeding conductor 6 and negative power feeding conductor 7 connected to the bonding wires 32, the light-emitting elements 3, and the bonding wires 32.

The sealing member 11 may contain appropriate quantity of fluorescent material. A fluorescent material is excited by the light emitted from the light-emitting elements 3, and emits light with a different color from the light emitted from the light-emitting elements 3. In the embodiment, as the light-emitting element 3 emits blue light, a yellow fluorescent material emitting yellow light that is a complementary color to blue light is used to emit white light. The sealing member 11 is filled in the frame member 10 in the uncured state by appropriate quantity, and then cured by heating, and fixed to the substrate 2 and frame member 10. Thus, the area sealed by the sealing member 11 is defined by the frame member 10.

The anti-noise part 4 is connected to a pair of lead-out terminals 8. The anti-noise part 4 is a capacitor functioning as a bypass element whose impedance is decreased for a noise. A ceramic chip capacitor is used here. Specifically, a terminal electrode of a ceramic chip capacitor is soldered to the edges of a pair of lead-out terminals 8.

The lead-out terminals 8 are led out to the outside of the mounting area for the light-emitting elements 3, specifically the outside of the frame member 10. Therefore, the anti-noise part 4 does not obstruct the light emitted from the light-emitting elements 3. The lead-out terminals 8 are formed by leading out a part of the positive power feeding conductor 6 and negative power feeding conductor 7, and can be simplified in the structure.

As shown in FIG. 1, a power feeding connector 12 is soldered to the substrate 2. The power feeding connector 12 is connected to the power feeding terminals 9 of the positive power feeding conductor 6 and negative power feeding conductor 7, and is electrically connected to a lighting control device described later. Through the power feeding connector 12, power is supplied from the lighting control device to the light-emitting elements 3, and the light-emitting elements 3 are lit.

Next, the circuit configuration of the lighting apparatus 20 is explained with reference to FIG. 4 and FIG. 5.

The lighting apparatus 20 comprises a lighting control device 21 as a direct current power supply, and the light-emitting device 1. The lighting control device 21 is connected to a commercial alternate current power supply AC, and generates a direct current output from the alternate current power supply AC. The commercial alternate current power supply AC is connected to the input terminal of a full-wave rectifier circuit 22. A smoothing capacitor 23 is connected between the output terminals of the full-wave rectifier circuit 22. It is allowed to use a power-factor improving circuit constituting a booster chopper, instead of the smoothing capacitor 23. The smoothing capacitor 23 is connected to a direct current voltage conversion circuit 24 and a current detection means 25. The lighting control device 21 has a control function of feeding back a current control signal to the direct current voltage conversion circuit 24 according to a result of detection in the current detection means 25, and making the output current constant.

The light-emitting device 1 is connected between the output terminals of the lighting control device 21, through the power feeding connector 12. The light-emitting device 3 comprises a plurality of series circuits in which a plurality of light-emitting elements 3 is connected in series, and a substrate 2 provided with a capacitor C as an anti-noise part 4 connected in parallel to both ends of the series circuit.

FIG. 5 is a schematic connection diagram showing a stray capacitance in the lighting apparatus 20. As shown in the drawing, the lighting apparatus 20 comprises a lighting control device 21 connected to a commercial alternate current power supply AC through a power switch SW, and an apparatus main body 26 housing a light-emitting device 1. The light-emitting device 1 is supplied a direct current from the lighting control device 21, and a light-emitting element 3 is lit. The apparatus main body 26 is made of conductive metal such as aluminum, and maintained at a ground potential.

When the light-emitting device 1 is energized, the light-emitting elements 3 covered with the sealing member 11 are simultaneously lit, and the light-emitting device is used as a surface light source to emit white light. During emission of light, the anti-noise part 4 placed outside the light-emitting element 3 mounting area does not obstruct the light emitted from the light-emitting element 3, and prevents reduction in the optical output. Further, while the light-emitting device 1 is lighting, the light emitted from the light-emitting element 3 to the substrate 2 reflects on the front layer of the reflection layer 5 in the direction of using the light.

As for a stray capacitance Cs, the apparatus main body 26 maintained at a ground potential forms one electrode, the positive power feeding conductor 6, negative power feeding conductor 7, and bonding wires 32 form the other electrode, and these electrodes are electrostatically coupled through a dielectric substance. A stray capacitance may be generated, when the positive power feeding conductor 6, negative power feeding conductor 7, and bonding wires 32 connecting the light-emitting elements 3 are close to the apparatus main body 26. In this case, even if the power switch SW is being turned off, a minute current flows as a leak current when a noise is superimposed on the power line, and the light-emitting element 3 may be accidentally lit.

In the embodiment, a capacitor functioning as a bypass element is connected as the anti-noise part 4 to both ends of the series circuit connected to a plurality of light-emitting elements 3, and a noise does not flow in the light-emitting elements 3, and is bypassed by flowing in the capacitor. Therefore, even if a noise is superimposed on the power line while the power switch SW is being turned off, a minute current is prevented to flow as a leak current in the light-emitting elements 3, and accidental lighting of the light-emitting elements 3 can be prevented.

As described above, according to the embodiment, it is possible to provide the light-emitting device 1 and lighting apparatus 20, which are configured to prevent accidental lighting of the light-emitting elements 3, and simply constructed so that the anti-noise part 4 do not obstruct the light emitted from the light-emitting elements 3.

Next, a second embodiment will be explained with reference to FIG. 6. The same components as those in the first embodiment are given the same reference number, and an explanation thereof is omitted.

Figure 6:
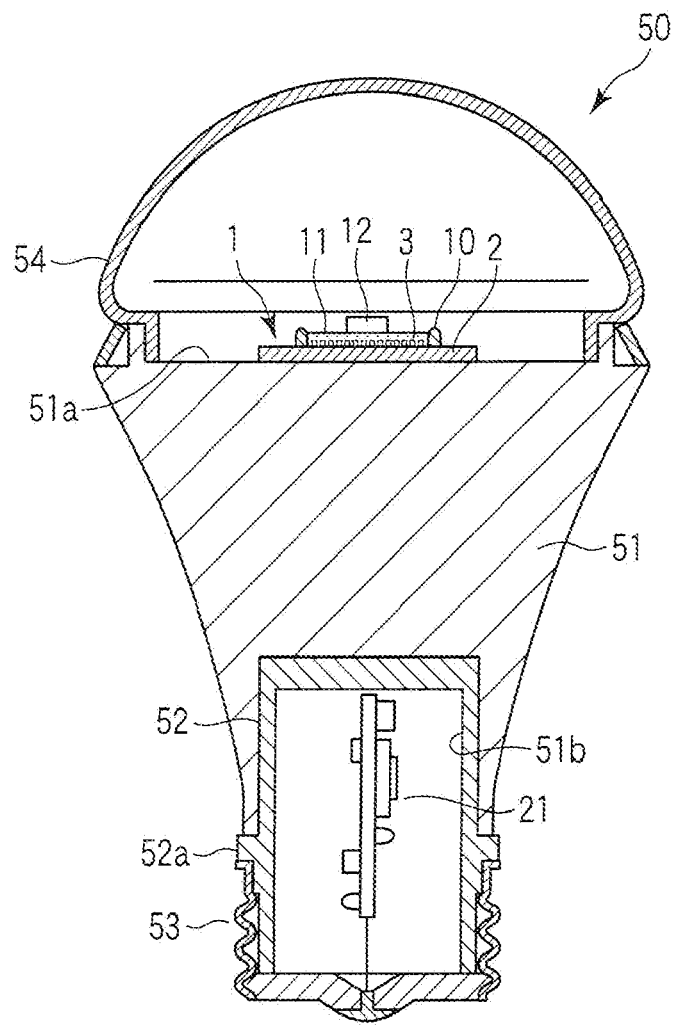
FIG. 6 is a sectional view of a lighting apparatus according to a second embodiment.

FIG. 6 shows a bulb-type LED lamp 50 as a lighting apparatus. The bulb LED lamp 50 basically comprises a light-emitting device 1 having the same structure as that of the first embodiment, and a lighting control device 21. As a different point, an anti-noise part 4 is a capacitor functioning as a protective element when a high voltage caused by a noise such as static electricity is applied to a light-emitting element 3. Therefore, the capacitor prevents damages and breakage of the light-emitting element 3.

The bulb-type LED lamp 50 comprises a light-emitting device 1, a main body 51 thermally connected to the light-emitting device 1, a lighting control device 21 configured to control lighting of an light-emitting element, a cover member 52 housing the lighting control device 21, a base 53 fit to the cover member 52, and a globe 54 placed over the light-emitting device 1 and fixed to the main body 51.

The main body 51 is made of metallic material with high heat conductivity such as aluminum, shaped substantially cylindrical with the diameter gradually increasing from one end to the other, and provided with a plurality of heat radiation fins on the outer circumferential surface. A fitting recess 51b to fit the cover member 52 is formed at one end, of the main body 51, and a fixing recess 51a for fixing the substrate 2 is formed at the other end of the main body 51.

The lighting control device 21 comprises a flat rectangular lighting circuit board and circuit components mounted on the circuit board. The lighting circuit board is housed in the cover member 52 with the longitudinal side erected. The substrate 2 and lighting device 21 are electrically connected by a lead wire passing through a not-shown wiring hole formed in the main body 51.

The cover member 52 is made of insulating material such as PBT resin, and shaped substantially cylindrical along the fitting recess 51b. A flange is formed on the entire outer circumference of the middle of the cover member 52 and projects in the radial direction from the cover member. The flange 52a serves as an insulating part for insulating between the base 53 and one of the main body 51.

The base 53 is E-shaped, and is electrically connected to the lighting control device 21 by wiring. The base 53 comprises a cylindrical shell with threads to be screwed into a lamp socket of a not-shown lighting fixture, and an eyelet provided at the top of the shell through an insulating part.

The globe 54 is made of light diffusing glass or synthetic resin, and shaped spherical to be continued to the other end of the main body 51. The globe 54 is formed to be gradually expanded from the top of the sphere, and reduced from the maximum diameter position.

In the bulb-type LED lamp 50 configured as above, for example, even if an excess voltage caused by static electricity is applied to the light-emitting element 3 during assembling, the light-emitting element 3 is protected from damage and breakage by the anti-noise part 4.

As shown in FIG. 4, in the light-emitting device 1, when an excess voltage caused by static electricity is applied to the series circuit connected to a plurality of light-emitting elements 3, the electric charge caused by the static electricity is connected in series with the electric charge of the capacitor C as an anti-noise part 4. Therefore, the electric charge caused by the static electricity is re-distributed to the capacitor C as an anti-noise part 4, and the electric charge by the static electricity applied to the series circuit of the light-emitting element 3 is reduced. Therefore, the voltage applied to the light-emitting element 3 is decreased, and the light-emitting element 3 is protected from damage and breakage.

As described above, in the bulb-type LED lamp 50 according to the second embodiment, it is possible to protect the light-emitting element 3 from damage and breakage, and to prevent the anti-noise part 4 from obstructing the light emitted from the light-emitting element 3, with a simple structure.

Next, a third embodiment will be explained with reference to FIG. 7 and FIG. 8. The same components as those in the first embodiment are given the same reference number, and an explanation thereof is omitted. In the third embodiment, the configuration of the lead-out terminal 8 is a main different point from the first embodiment.

Figure 8:
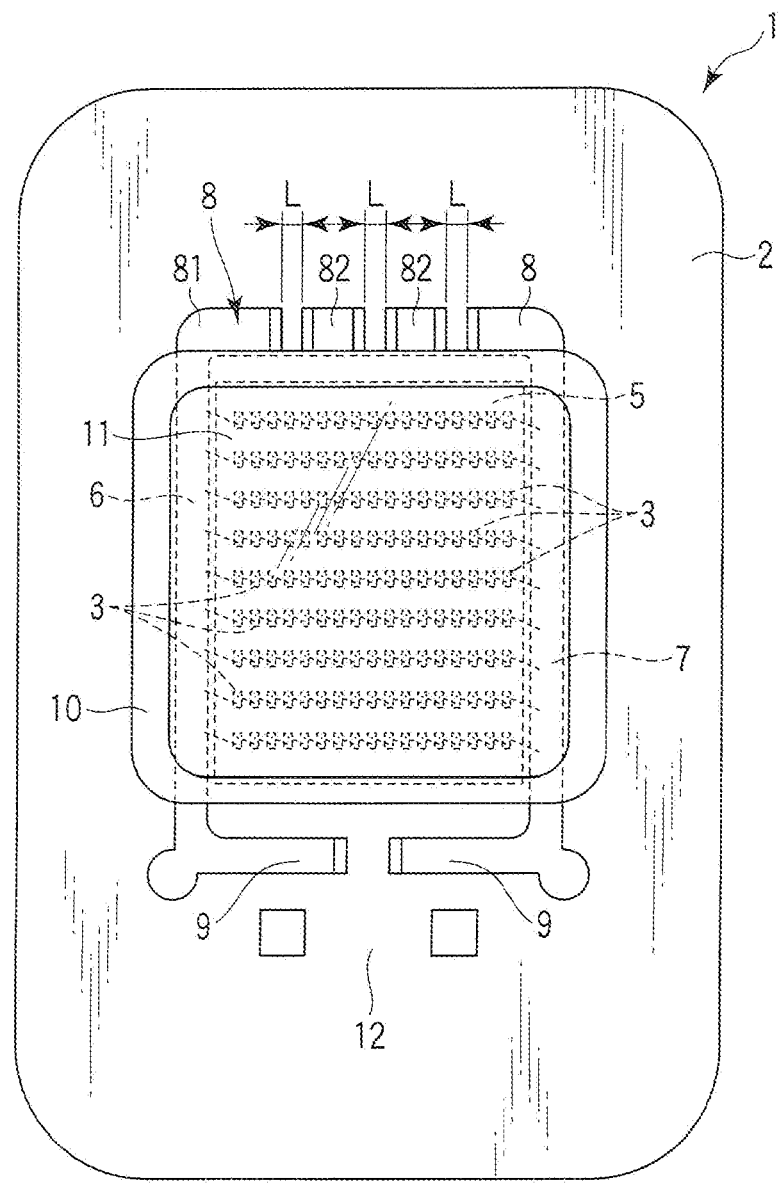
FIG. 8 is a plan view of the light-emitting device before anti-noise parts and connectors are mounted.

As shown in FIG. 8, the lead-out terminal 8 of the positive power feeding conductor 6 and negative power feeding conductor is divided, and each lead-out terminal 8 is formed of a pair of lead-out conductors 81, and two connection conductors 82. A pair of lead-out conductors 81 is continued from the positive power feeding conductor 6 and negative power feeding conductor 7, and the two connection conductors 82 are independently formed with gap between the edges of the power feeding conductors. Further, two connection conductors 82 are spaced apart from each other by a predetermined distance (insulation distance) L.

Figure 7:
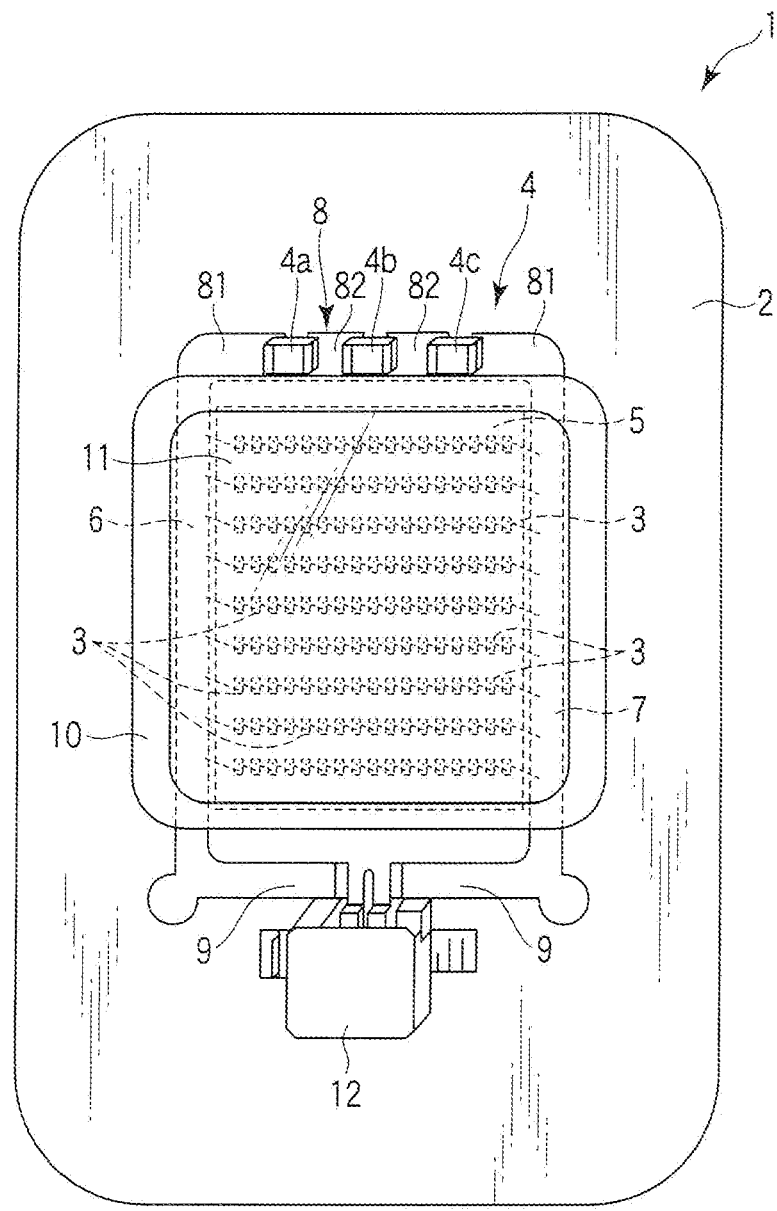
FIG. 7 is a front plan view of a light-emitting device according to a third embodiment.

As shown in FIG. 7, a ceramic chip capacitor as an anti-noise part 4 is connected to the lead-out terminal 8. Specifically, three ceramic capacitors 4a, 4b and 4c are sequentially placed from the left to the right side in the drawing. The electrode terminal of the left-side ceramic chip capacitor 4a is connected to the lead-out conductor 81 led out from the positive power feeding conductor 6 and the connection conductor 82. The terminal electrode of the middle ceramic chip capacitor 4b is connected to the connection conductor 82 and the next connection conductor 82. The terminal electrode of the right-side ceramic chip capacitor 4c is soldered to the lead-out conductor 81 led out from the negative power feeding conductor 7.

The lead-out terminal 8 is provided with a predetermined distance L. However, after the apparatus is used for a long time, a migration phenomenon occurs, and the metallic component moves in the distance L on the insulation layer on the surface of the substrate 2 due to the influence of electric field, and the insulation between the conductors is reduced.

However, in this embodiment, the lead-out terminal 8 is divided into two or more portions, and three clearances, that is, the insulation distance L is defined between a pair of lead-out conductors 81, and the total distance is three times of one insulation distance L. This increases the insulation distance between the lead-out conductors, and prevents reduction of insulation by the migration phenomenon.

It is proved by experiment that the insulation by the migration phenomenon is defined by the total insulation distance L. In other words, when the total insulation distance L is longer, the effect to prevent insulation reduction by migration is higher.

An explanation will be given of an embodiment incorporating the above-mentioned lead-out terminal 8 and anti-noise part 4.

Generally, when an electronic component is mounted, on a substrate, the insulation distance (insulation distance) between the power feeding conductors is determined by the size of an electronic component. Thus, it is difficult to ensure the insulation distance L enough to prevent reduction of the insulation by a migration phenomenon.

For example, when one ceramic chip capacitor with capacitor of 0.3 µF is used for the anti-noise part 4 (refer to FIGS. 1 and 2), sufficient insulation distance L may not be ensured for the lead-out terminals 8. In this case, to ensure the insulation distance L, the capacitor is divided, and three 1 µF capacitors are connected in series, thereby the total capacity of 0.3 µF can be set, and the total insulation distance L can be set longer.

Therefore, even though the insulation distance L is usually depend on the size of the condenser, it is possible to prevent reduction of the insulation due to a migration phenomenon, by setting the total of the insulation distance L longer by dividing a capacitor and connecting the divided capacitors.

A capacitor may be used in two or more pieces, and the number of capacitors is not particularly limited. For example, two capacitors may be used to ensure the distance (insulation distance) L. The anti-noise part 4 may be configured to function as a bypass element or a protective element.

As described above, in the light-emitting device 1 according to the third embodiment, it is possible to prevent reduction of the insulation by a migration phenomenon, and to prevent the anti-noise part 4 from obstructing the light emitted from the light-emitting element 3, with a simple structure.

Next, a fourth embodiment will be explained with reference to FIG. 9. FIG. 9 shows a circuit configuration of a lighting apparatus 20, and corresponds to FIG. 4 in the first embodiment. The same components as those in the first embodiment are given the same reference number, and an explanation thereof is omitted.

A main different point of the fourth embodiment compared with the first embodiment is that a constant-voltage diode ZD is connected in anti-parallel at both ends of a plurality of series circuits in which a plurality of light-emitting elements 3 as an anti-noise part 4 is connected in series. The constant-voltage diode ZD as an anti-noise part 4 functions as a protective element when a high voltage caused by a noise such as static electricity is applied to the light-emitting element 3.

For example, when static electricity flows into a series circuit in which a plurality of light-emitting elements 3 is connected, if the static electricity is forward to the constant-voltage diode ZD, most current does not flow into the constant-voltage diode ZD, and does not flow into the light-emitting elements 3. If the static electricity is reverse to the constant-voltage diode ZD, the constant-voltage diode Z is nonconductive up to a breakdown voltage, but when a voltage is applied exceeding the breakdown voltage, the diode ZD becomes conductive, and a current easily flows from the light-emitting elements 3 to the constant-voltage diode ZD.

As described above, in the lighting apparatus 20 according to the fourth embodiment, a constant-voltage diode ZD is used as an anti-noise part 4, it is possible to prevent a damage and breakage of the light-emitting element 3, and to prevent the anti-noise part 4 from obstructing the light emitted from the light-emitting element 3, with a simple structure, as in the second embodiment.

Next, a fifth embodiment will be explained with reference to FIG. 10 to FIG. 14. The same components as those in the first embodiment are given the same reference number, and an explanation thereof is omitted.

Figure 10:
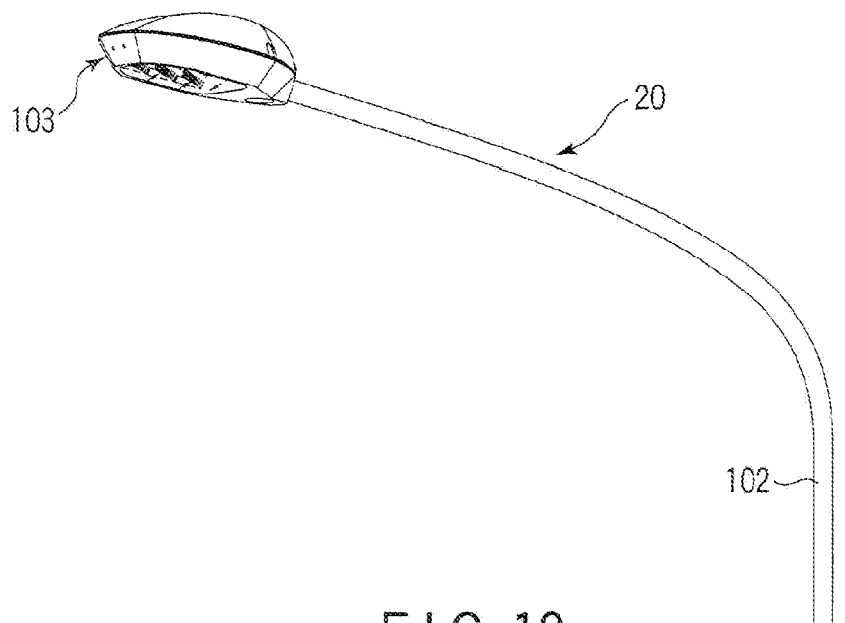
FIG. 10 is a perspective view of a street light according to a fifth embodiment.
Figure 11:
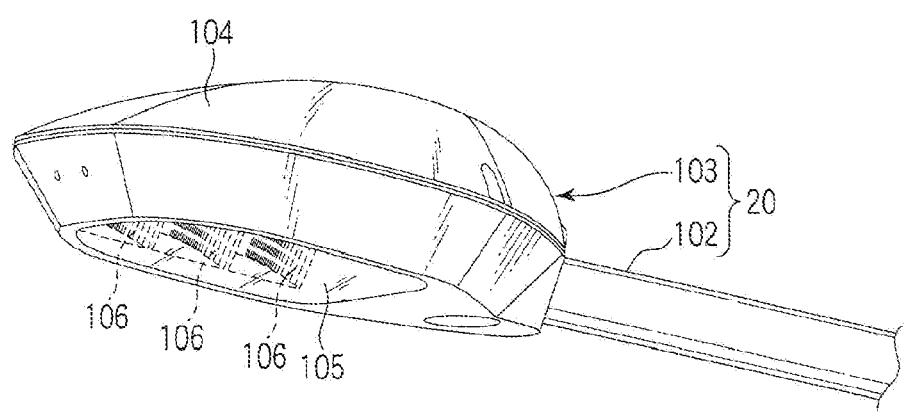
FIG. 11 is a perspective view of the street light.

FIG. 10 and FIG. 11 show a street light 20 installed for lighting a street, as a lighting apparatus according to a fifth embodiment. The street light 20 comprises a pole 102, and a lighting fixture 103 fixed to the pole. The pole 102 is stood on a roadside, and its upper part is bent over a road. The lighting fixture 103 comprises a main body, for example, a lamp body 104 connected to the pole 102 as shown in FIG. 11, a translucent cover 105 fit to the lamp body 104 covering the lower opening of the lamp body 104 facing to a road, and at least one light source unit 106 housed in the lamp body 104, opposing to the translucent cover 105. The lamp body 104 is formed of a metal, for example, formed by combining a plurality of aluminum die-cast moldings. The translucent cover 105 is made of reinforced glass.

Figure 13:
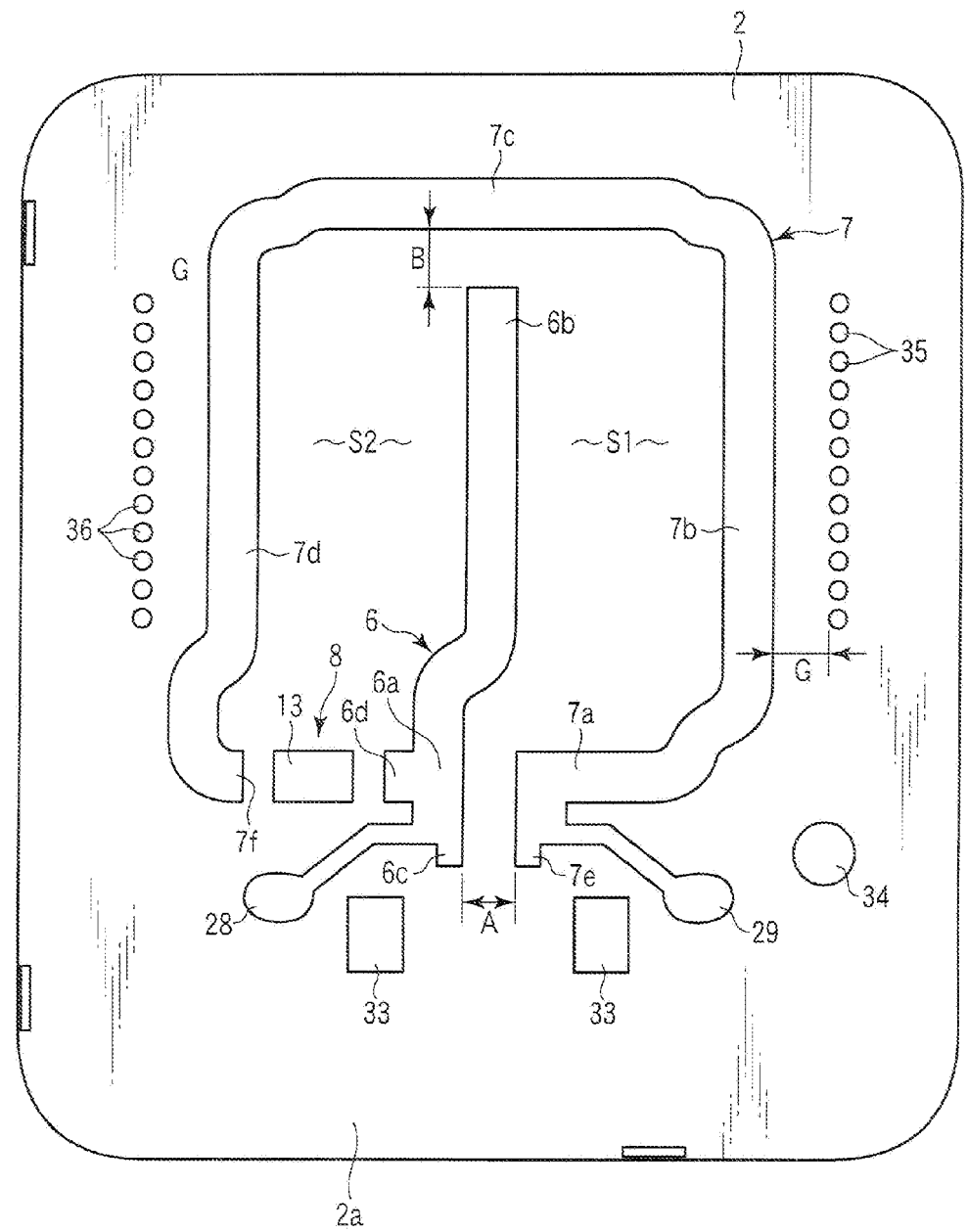
FIG. 13 is a plan view of the light-emitting device before anti-noise parts and connectors are mounted.
Figure 14:
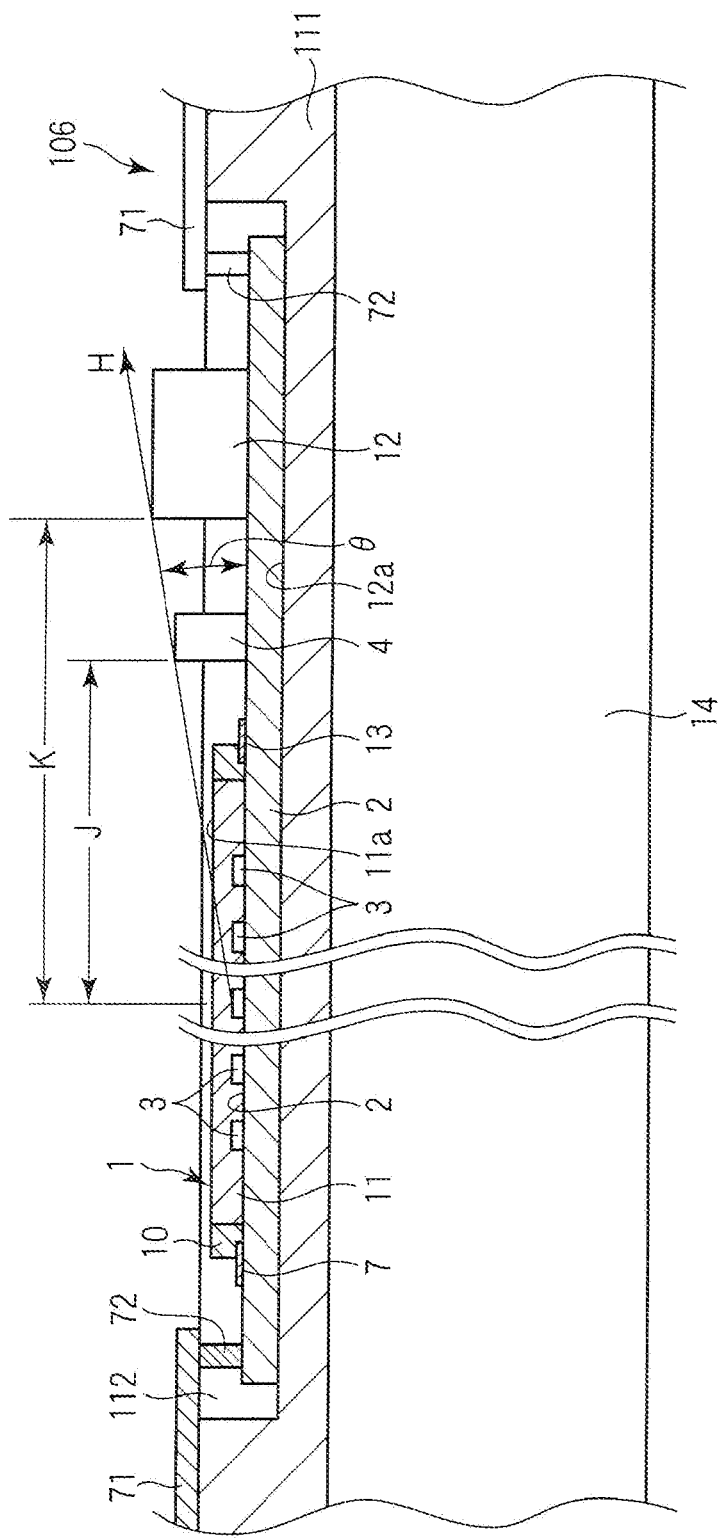
FIG. 14 is a sectional view of the light-emitting device.

The light-emitting device 1 arranged in the light source unit 106 will be explained. As shown in FIG. 12, FIG. 13 and FIG. 14, the light-emitting device 1 comprises a substantially rectangular substrate 2 with an insulative surface, a positive power feeding conductor 6 and a negative power feeding conductor 7 formed as a pattern on the surface of the substrate, alignment marks 35 and 36, a first protective layer 37, a second protective layer 38, a plurality of light-emitting elements 3, bonding wires, a frame member 10, a sealing member 11, a power feeding connector 12, and capacitors 4.

The substrate 2 is made of white ceramics, for example white $AL_2O_3$ (aluminum oxide). The substrate 2 may be made of aluminum oxide, and other ceramics mixed thereto. In this case, as the aluminum oxide is a main component, and its content is desirably higher than 70%.

An average reflectivity of the white substrate 2 against a visible light area is higher than 80%, preferably over 85% and below 99%. Therefore, the substrate 2 has a similar light reflectivity against blue light with a specific emission wavelength of 440 to 460 nm emitted from an LED described later, and yellow light with a specific emission wavelength of 470 to 490 nm emitted from a fluorescent material described later. One side of the substrate 2 is used as a component mounting surface 2a. The positive power feeding conductor 6 and negative power feeding conductor 7 comprising a wiring pattern are arranged on the component mounting surface 2a.

As shown in FIG. 12 and FIG. 13, the positive power feeding conductor 6 comprises a base part 6a, and a common wire connector 6b. The common wire connector 6b extends straight. The base part 6a and common wire connector 6b are substantially parallel, and are connected as one body through an oblique pattern part. The base part 6a is provided with a first positive electrode pad 6c and a second positive electrode pad 6d as one body.

The negative power-feeding conductor 7 comprises a base part 7a, a first wire connector 7b, an intermediate pattern part 7c, and a second wire connector 7d. The negative power feeding conductor 7 surrounds the positive power feeding conductor 6.

In other words, the base part 7a is adjacent to the base part 6a of the positive power feeding conductor with a predetermined insulation distance L (refer to FIG. 13). The first negative electrode pad 7e is arranged in the base part 7a of the negative electrode side as one body. The first wire connector 7b is bent approximately 90° and continued to the base part 7a of the negative electrode side. The first wire connector 7b is substantially parallel to the common wire connector 6b of the positive electrode side across a first element providing space S1.

The intermediate pattern part 7c of the negative electrode side is bent approximately 90° and connected to the first wire connector 7b. The intermediate portion in the longitudinal direction of the intermediate pattern part 7c is adjacent to the distal end of the common wire connector 6b with an insulation distance B (refer to FIG. 13) more than the insulation distance L. To ensure the insulation distance B, both ends of the intermediate pattern part 7c are inclined in the reverse direction to each other, and the intermediate pattern part 7c is substantially curved. Therefore, the intermediate portion in the longitudinal direction of the intermediate patter part 7c is separated away from the distal end of the common wire connector 6b.

The second wire connector 7d is bent approximately 90° and continued to the intermediate pattern part 7c as one body. Therefore, the second wire connector 7d is substantially parallel to the common wire connector 6b of the positive electrode side across a second element providing space S2. Therefore, the negative power feeding conductor 7 surrounds the positive power feeding conductor 6 from three directions.

A second negative electrode pad 7f is continued to the distal end of the second wire connector 7d as one body, opposing the second positive electrode pad 6d. The second negative electrode pad 7f is apart from the second positive electrode pad 6d. Between these pads, an intermediate pad 13 is arranged on the component mounting surface 2a. The second negative electrode pad 7f, second positive electrode pad 6d and intermediate pad 13 are led out to the outside of the light-emitting element 3 mounting area described later, forming the lead-out terminal 8. In this embodiment, the lead-out terminal 8 is divided into two or more parts, and each part is formed of a pair of lead-out conductor 81, and two connection conductors 82. Each lead-out conductor 81 comprises a second positive electrode pad 6d and second negative electrode pad 7f (lead-out conductor) continued from the positive power feeding conductor 6 and negative power feeding conductor 7, respectively, and an intermediate pad (connection conductor) 13 placed between the above pads with a clearance.

Further, on the component mounting surface 2a, there are provided lighting check pads 28 and 29 for a lighting test, a temperature check pad 34 for measuring temperatures, and a surface-mounted pad 33 for fixing components.

In other words, the lighting check pad 28 is connected to the positive power feeding conductor 6, and the lighting check pad 29 is connected to the negative power feeding conductor 7. The temperature check pad 34 is independently arranged near the lighting check pad 29 and negative power feeding conductor 7, without being electrically connected to them. The temperature of the light-emitting device 1 can be measured by connecting a thermocouple to the temperature check pad 34. The surface-mounted pad 33 is formed in a pair, and arranged between the lighting check pads 28 and 29.

The alignment marks 35 and 36 are provided on both sides of the first wire connector 7b adjacent to the first element providing space S1, and the second wire connector 7d adjacent to the second element providing space S2, with the common wire connector 6b placed between the spaces S1 and S2.

The positive power feeding conductor 6, negative power feeding conductor 7, intermediate pad 13, lighting check pads 28 and 29, surface-mounted pad 33, and alignment marks 35 and 36 are made of the same metal such as silver, specifically made mainly of silver. They are screen printed on the component mounting surface 22a. They may be provided by plating instead of printing.

The first protective layer 37 and second protective layer 38 are made of electrically insulating material, and printed on the component mounting surface 2a by screen printing, covering mainly the part of the silver printed element not sealed by the sealing member 11 to prevent deterioration of this part.

Each of a plurality of light-emitting element 3 uses a light-emitting element generating heat in the lighting state, for example, a blue chip LED emitting blue light. These light-emitting, elements 3 are preferably provided with a semiconductor light-emitting layer on a sapphire glass translucent element board, and a bare chip comprising a pair of element electrodes arranged on the light-emitting layer.

The half of the light-emitting elements 3 is directly mounted on the substrate 2 in the first element providing space S1. The mounting is realized by bonding the element board to the component mounting surface 2a by means of a transparent die-bond. The light-emitting elements 3 mounted on the first element providing space S1 are aligned in matrix. Similarly, the remaining light-emitting elements 3 are directly mounted on the substrate 2 in the second element providing space S2. This mounting is also realized by bonding the element board to the component mounting surface 2a by means of a transparent die-bond. The light-emitting elements 3 mounted on the second element providing space S2 are aligned in matrix.

The lighting-emitting elements 3 disposed in the first element providing space S1 and the light-emitting elements 3 disposed in the second element providing space S2 are symmetrical with respect to the common wire connector 6b.

The light-emitting elements 3 aligned in the direction in which the common wire connector 6b of the positive power feeding conductor 6 and the first wire connector 7b of the negative power feeding conductor 7 are arranged in parallel are connected in series by bonding wires 47. The light-emitting element 3 placed at one end of the series connected light-emitting element line 45R is connected to the common wire connector 6b by a bonding wire 48. The light-emitting element 3 placed at the other end of the light-emitting element line 45R is connected to the first wire connector 7b by a bonding wire 49.

Similarly, the light-emitting elements 3 are aligned in the direction in which the common wire connector 6b and the second wire connector 7d of the negative power feeding conductor 7 are arranged in parallel, and connected in series by bonding wires 60. The light-emitting element 3 placed at one end of the series connected light-emitting element line 45L is connected to the common wire connector 6b by a bonding wire 61. The light-emitting element 3 placed at the other end of the light-emitting element line 45L is connected to the second wire connector 7d by a bonding wire 62. The bonding wires 47 to 62 are made of thin metallic wire preferably a gold wire, and are provided by wire bonding.

By electrically connecting the light-emitting elements 3 mounted on the substrate 2 as described above, a chip-on-board (COB) type light-emitting device 1 is formed. By the electrical connection, the light-emitting elements 3 in the element providing spaces S1 and S2 are arranged as twelve lines of first light-emitting elements 45R and twelve lines of second light-emitting elements 45L, electrically connected in parallel, each line consisting of seven light-emitting elements 3, for example.

As shown in FIG. 12 and FIG. 14, the frame member 10 is shaped rectangular, for example, and mounted on the component mounting surface 22a, surrounding inside the wire connectors 6b, 7b and 7d, the light-emitting element 3 mounting area, and the bonding wires 47 to 52. The frame member 10 is preferably made of white synthetic resin. The frame member 10 is mounted on a part of the first protective layer 37 and second protective layer 38. The second positive electrode pad 6d, second negative electrode pad 7f, and intermediate pad 13 forming the lead-out terminal 8 are arranged on the substrate 2 outside the frame member 10.

The sealing member 11 is filled in the frame member 10, and provided on the substrate, sealing the wire connectors 6b, 7b and 7d, the light-emitting elements 3, and the bonding wires 47 to 52, in a buried state. The sealing member 57 uses translucent resin material such as silicon resin. The sealing member may be made of epoxy resin or urea resin, instead of silicon resin. The sealing member 11 is gas permeable.

The sealing member 11 is mixed with fluorescent material (not shown). Fluorescent material is excited by the light emitted from the light-emitting elements 3, emits light of different color, and forms light of color necessary for lighting by combining the emitted different color of light and the emission color of the light-emitting elements 3. Yellow fluorescent material is used to obtain while illumination color under the condition using a blue LED as a light-emitting element. Red, blue and yellow fluorescent materials may be used to obtain white illumination color under the condition using an ultraviolet-rays emitting LED as a semiconductor light-emitting element.

White light is formed by mixing the blue light emitted from the blue LED and yellow light complementary to the blue light. The white light is emitted from the surface of the sealing member 11 to the light using direction. Therefore, the surface or the light-emitting surface of the sealing member 11 forms a light-emitting surface 11a of the light-emitting device 1. The size of the light-emitting surface 11a is defined by the frame member 10.

As shown in FIG. 12 and FIG. 14, on the component mounting surface 2a, one power feeding connector 12 comprising a surface mounting component, and two capacitors 4 as anti-noise components are mounted. The power feeding connector 12 is of a 2-pin type comprising a first terminal pin 12a, and a second terminal pin 12b. The power feeding connector 12 is soldered to the surface-mounted pad 33, thereby being located between the lighting check pads 28 and 29. The first terminal pin 12a is soldered to the first positive electrode pad 6c, and the second terminal pin 12b is soldered to the first negative electrode pad 7e. A direct current feeding insulation coating wire connected to a not-shown power supply unit is inserted into the power feeding connector 12. Thereby, power can be supplied to the light-emitting device 1 through the power feeding connector 12.

One of two capacitors 4 is soldered to one end of the second positive electrode pad 6d and intermediate pad 13 of the positive power feeding conductor 6, and is arranged across these parts. The other capacitor 4 is soldered to the other end of the second negative electrode pad 7f and intermediate pad 13 of the negative power feeding conductor 7, and is arranged across these parts. Two capacitors 4 are positioned outside the frame member 10, or outside the light-emitting element 3 mounting area.

In the normal lighting state in which a direct current is supplied to each light-emitting element 3, a current does not flow in the capacitors 4. When a noise is superimposed on the power line and an alternate current flows, a current flows in the capacitors 4, the positive power feeding conductor 7 and negative power feeding conductor 7 are shorted, thereby preventing supply of alternate current to each light-emitting element 3.

As shown in FIG. 14, the height of the capacitors 4 is lower than the power feeding connector 12. As the height of an electrical component is higher, the component is placed away from the center of the sealing member 11 excited to emit light, or the center of emission. In FIG. 14, a reference J represents the distance between the center of emission and the capacitor 4 lower than the power feeding connector 12, K indicates the distance between the center of emission and the power feeding connector 12 higher than the capacitor 4, and K is larger than J.

By placing the electrical components according to their heights, the angle θ formed between the component mounting surface 2a and the emission line H emitted from the light-emitting element 3 indicated by an arrow in FIG. 14 can be reduced. Accordingly, it is possible to increase the angle of the emitted light, while preventing the emission line H from being interrupted by the high power feeding connector 12.

As shown in FIG. 14, the light-emitting device 1 configured as described above is supported by the device base 111 of the light source unit 106 with the surface opposite to the component mounting surface 2a closely contacting the bottom surface 112a of a mounting section 112. In the state that the light-emitting device 1 supported as above is being secured to the lamp body 104, the light-emitting surface 11a is opposed to the translucent cover 105.

For supporting the light-emitting device 1, a plurality of, for example, two metallic holder plates 71 are screwed to the device base 111. The end portions of the holder plates 71 are opposed to the circumference of the substrate 2, and are provided with metallic springs 72 to press the circumference of the substrate 2. The springs 72 holds the rear side of the substrate 2 closely contacting the bottom surface 112a.

As described above, in the light-emitting device 1 and street light according to the fifth embodiment, it is possible to prevent reduction of the insulation by a migration phenomenon, and to prevent the anti-noise part 4 from obstructing the light emitted from the light-emitting element 3, with a simple structure.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

For example, a capacitor and a constant-voltage diode are used as anti-noise parts. Anti-noise parts are not particularly limited to these parts. A plurality of light-emitting devices may be connected in series or parallel to increase the light quantity of a lighting apparatus. A lighting apparatus is applicable to a lighting fixture used indoors and outdoors, and a display unit.

As a method of mounting light-emitting elements on a substrate, a chip-on-board method to directly insert a bare chip into a substrate, and a soldering method of soldering packaged surface-mounted components are applicable. A mounting method is not particularly limited.

What is claimed is:

1. A light-emitting device comprising:
a substrate including an insulating surface:
a plurality of light-emitting elements mounted on the surface of the surface of the substrate and electrically connected to each other;
a positive power feeding conductor and a negative power feeding conductor disposed on the surface of the substrate to feed power to the light-emitting elements;
lead-out terminals leading from the power feeding conductors, to the outside of an mounting area of the light-emitting elements; and
an anti-noise part connected to the lead-out terminals and arranged outside the mounting area,
wherein the anti-noise part includes a plurality of the same elements,
the lead-out terminals include a pair of lead-out conductors continued respectively from each of the power feeding conductors, and at least one connection conductor is placed between edges of the lead-out conductors with a predetermined distance.

2. The light-emitting device according to claim 1, wherein the same elements are connected between the lead-out conductor and the connection conductor, or between either of the connection conductor and the other connection conductor.

3. The light-emitting device according to claim 1, further comprising a reflection layer formed on the mounting area of the substrate, wherein the light-emitting elements are mounted on the reflection layer, and
the anti-noise part is arranged outside the reflection layer.

4. The light-emitting device according to claim 1, further comprising a frame member on the substrate, surrounding the mounting area; and
 a sealing member filled on the light-emitting elements, inside the frame member,
 wherein the anti-noise part is arranged outside the frame member.

5. The light-emitting device according to claim 1, further comprising a power feeding connector mounted on the substrate and connected to the positive power feeding conductor and the negative power feeding conductor;
 wherein the power feeding connector is higher than the anti-noise part and placed outside the anti-noise part with respect to the mounting area.

6. A lighting apparatus comprising:
an apparatus main body:
a light-emitting device arranged in the apparatus main body, the light-emitting device including:
 a substrate including an insulating surface;
 a plurality of light-emitting elements mounted on the surface of the substrate and electronically connected to each other;
 a positive power feeding conductor and a negative power feeding conductor disposed on the surface of the substrate to teed power to the light-emitting elements;
 lead-out terminals leading from the power feeding conductors, to the outside of a mounting area of the light-emitting elements; and
 an anti-noise part connected to the lead-out terminals and arranged outside the mounting area; and
a lighting control device configured to supply power to the light-emitting device,
wherein the anti-noise part includes a plurality of the same elements, the lead-out terminals include a pair of lead-out conductors continued respectively from each of the power feeding conductors, and at least one connection conductor placed between edges of the lead-out conductors with a predetermined distance.

7. The lighting apparatus according to claim 6, wherein the same elements are connected between the lead-out conductor and the connection conductor, or between either of the connection conductor and the other connection conductor.

8. The lighting apparatus according to claim 6, further comprising a reflection layer formed on the mounting area of the substrate, wherein the light-emitting elements are mounted on the reflection layer, and the anti-noise part is arranged outside the reflection layer.

* * * * *